(12) United States Patent
Peng et al.

(10) Patent No.: US 10,295,629 B2
(45) Date of Patent: May 21, 2019

(54) GRADIENT COIL ASSEMBLY, GRADIENT COIL, AND MAGNETIC RESONANCE IMAGING SYSTEM

(71) Applicants: Wei Ping Peng, Shenzhen (CN); Stefan Stocker, Großenseebach (DE); Chao Wang, Shenzhen (CN)

(72) Inventors: Wei Ping Peng, Shenzhen (CN); Stefan Stocker, Großenseebach (DE); Chao Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 1160 days.

(21) Appl. No.: 14/551,888

(22) Filed: Nov. 24, 2014

(65) Prior Publication Data

US 2015/0153429 A1     Jun. 4, 2015

(30) Foreign Application Priority Data

Nov. 29, 2013   (CN) .......................... 2013 1 0628682

(51) Int. Cl.
*G01V 3/00* (2006.01)
*G01R 33/385* (2006.01)

(52) U.S. Cl.
CPC ................ *G01R 33/3858* (2013.01)

(58) Field of Classification Search
CPC .................................................. G01R 33/3858
USPC ................................................... 324/318, 322
See application file for complete search history.

(56) References Cited

U.S. PATENT DOCUMENTS

| 3,106,013 | A | * | 10/1963 | Rozmus | B23K 20/028 228/115 |
| 4,315,175 | A | * | 2/1982 | Hamilton | H01R 4/029 174/90 |
| 4,794,338 | A | * | 12/1988 | Roemer | G01R 33/4215 324/318 |
| 8,067,939 | B2 | | 11/2011 | Schuster | |

* cited by examiner

*Primary Examiner* — Louis M Arana
(74) *Attorney, Agent, or Firm* — Lempia Summerfield Katz LLC

(57) ABSTRACT

The present embodiments provide a gradient coil assembly. The gradient coil assembly includes an aluminum wire body, and a copper wire end connected by cold pressure welding to two ends of the aluminum wire body. Using the gradient coil according to a particular embodiment, it is possible to reduce gradient coil weight as well as reduce the thickness of an outer vacuum chamber used for a magnet, thereby reducing the cost of the magnet and gradient coil, and making it less difficult to install and maintain the magnet and gradient coil. There is no problem of oxidation associated with the cold pressure welding of the aluminum wire body to the copper wire ends, so quality defects arising from such oxidation are avoided.

6 Claims, 2 Drawing Sheets

GRADIENT COIL ASSEMBLY, GRADIENT COIL, AND MAGNETIC RESONANCE IMAGING SYSTEM

CROSS-REFERENCE TO RELATED APPLICATIONS

This application claims the benefit of CN 201310628682.6, filed on Nov. 29, 2013, which is hereby incorporated by reference in its entirety.

TECHNICAL FIELD

The present embodiments relate to a magnetic resonance imaging (MRI) system and, in particular, to a gradient coil and gradient coil assembly of the MRI system.

BACKGROUND

MRI is a type of imaging technology involving biomagnetics and nuclear spin. MRI has developed rapidly together with computer technology, electronic circuit technology, and superconductor technology. The main principles of the phenomenon of magnetic resonance are as follows. If an atomic nucleus contains a single proton, as is the case, for example, with the nuclei of the hydrogen atoms that are present throughout the human body, this proton exhibits spin motion and resembles a small magnet. Moreover, the spin axes of these small magnets lack a definite pattern, and if an external magnetic field is applied, the small magnets will be rearranged according to the magnetic force lines of the external field. Specifically, the small magnets will line up in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis; the atomic nuclei only have a longitudinal magnetization component, which has both a direction and a magnitude. A radio frequency (RF) pulse of a specific frequency is used to excite the atomic nuclei in the external magnetic field such that their spin axes deviate from the positive longitudinal axis or negative longitudinal axis, giving rise to resonance. This is the phenomenon of magnetic resonance. Once the spin axes of the excited atomic nuclei have deviated from the positive or negative longitudinal axis, the atomic nuclei have a transverse magnetization component. Once emission of the RF pulse has stopped, the excited atomic nuclei emit an echo signal, gradually releasing the absorbed energy in the form of electromagnetic waves, such that the phase and energy level of the nuclei both return to the pre-excitation state. An image may be reconstructed by subjecting the echo signal emitted by atomic nuclei to further processing, such as spatial encoding.

In an MRI system, the gradient coils are key components for producing a linear gradient magnetic field. The gradient coil at least includes a main coil set and a shield coil set; the main coil set and shield coil set each further include three layers of coils. Copper wire may be used as a conductor to weld together the main coils and shield coils using a flux. In order to save costs while reducing the weight of the gradient coils, it is possible to develop and use aluminum wire, but due to its tendency to oxidize easily, aluminum wire is difficult to weld using flux. Thus, it is not possible to manufacture aluminum wire gradient coils on a large scale.

U.S. Pat. No. 8,067,939 proposes the use of two conductors of different shapes to form a gradient coil, wherein planar conductors (e.g., made of aluminum material and formed by waterjet cutting or laser cutting, etc.) are welded to ordinary copper conductors with a rectangular cross section. This solution does not suggest how to solve the problem of oxidation that arises when copper and aluminum are welded together using flux.

SUMMARY AND DESCRIPTION

The scope of the present invention is defined solely by the appended claims and is not affected to any degree by the statements within this summary. The present embodiments may obviate one or more of the drawbacks or limitations in the related art.

In response to the above technical problem, in order to mass-produce aluminum wire gradient coils and solve the problem of oxidation of aluminum wires, the present embodiments propose a gradient coil assembly, including an aluminum wire body, and a copper wire end connected by cold pressure welding to two ends of the aluminum wire body.

The cold pressure welding may include lap and butt connections.

The present embodiments also propose a gradient coil, including a main coil set and a shield coil set, the main coil set, and the shield coil set being in the form of concentric cylinders, and the radius of the shield coil set being greater than that of the main coil set. The main coil set includes at least one layer of main coil, the main coil being formed by welding together one of two pairs of the copper wire ends of two of the gradient coil assemblies described above with the copper wire ends symmetrically placed relative to each other. The shield coil set includes at least one layer of shield coil, the shield coil being formed by welding together one of two pairs of the copper wire ends of two of the gradient coil assemblies described above with the copper wire ends symmetrically placed relative to each other.

The main coil set may include three layers of the main coil, while the shield coil set includes three layers of the shield coil.

Each layer of the main coil and each layer of the shield coil may be welded together in a corresponding manner, according to the positions of each layer of the main coil, and each layer of the shield coil in the main coil set and the shield coil set.

The present embodiments also propose an MRI system, characterized by including the gradient coil described above.

Based on the above technical solution, since aluminum wire replaces copper wire as the body in the gradient coil assembly according to a particular embodiment, costs are reduced. Moreover, the use of copper wire for the ends facilitates welding to other coil assemblies or other components, thereby facilitating mass production. Furthermore, there is no problem of oxidation associated with the welding of the aluminum wire body to the copper wire ends by pressing, so quality defects arising from such oxidation are avoided. At the same time, using the gradient coil according to a particular embodiment, it is possible to reduce gradient coil weight as well as reduce the thickness of an outer vacuum chamber used for a magnet, thereby reducing the cost of the magnet and gradient coil, and making it less difficult to install and maintain the magnet and gradient coil.

DETAILED DESCRIPTION

A gradient coil assembly according to a particular embodiment includes an aluminum wire body, and a copper wire end connected by cold pressure welding to two ends of the aluminum wire body. Since, in the gradient coil assembly according to a particular embodiment, aluminum wire replaces copper wire as the body, costs are reduced. Moreover, the use of copper wire for the ends facilitates welding to other coil assemblies or other components, thereby facilitating mass production. Furthermore, there is no problem of oxidation associated with cold pressure welding of the aluminum wire body to the copper wire ends, so quality defects arising from such oxidation are avoided.

Figure 1:
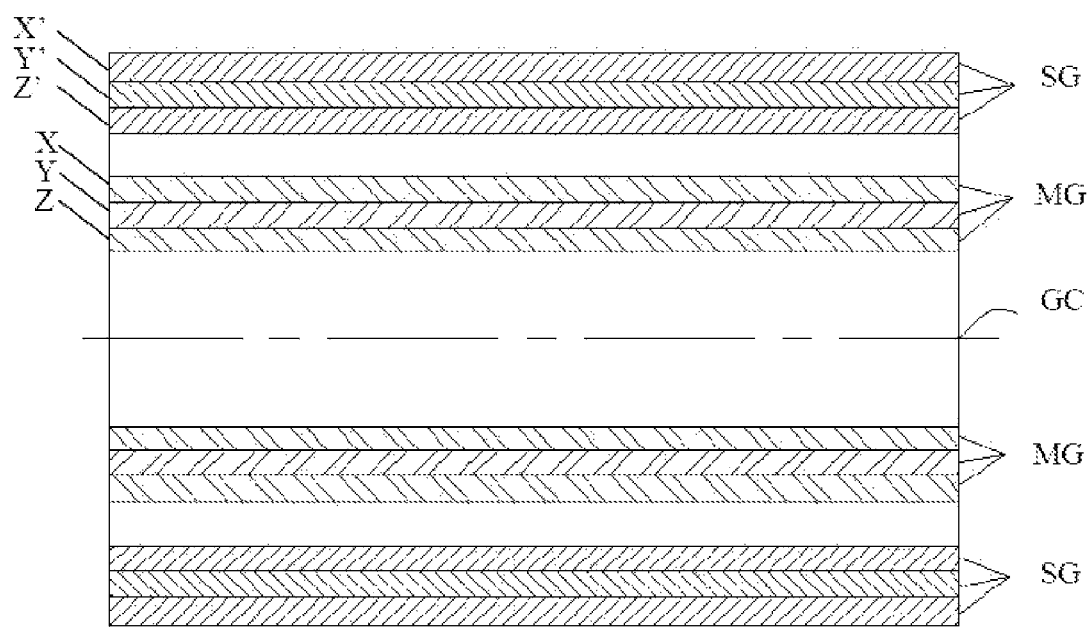
FIG. 1 depicts a sectional view of a gradient coil according to a particular embodiment.

FIG. 1 is a sectional view of the gradient coil according to a particular embodiment. As FIG. 1 depicts, the gradient coil according to a particular embodiment includes a main coil set and a shield coil set, wherein the main coil set includes at least one layer of main coil (as FIG. 1 depicts, three layers, labeled X, Y and Z from top to bottom, with the order being adjustable according to the actual design). The shield coil set includes at least one layer of shield coil (as FIG. 1 depicts, three layers, labeled X', Y' and Z' from top to bottom, with the order being adjustable according to the actual design). The main coils are connected to the corresponding shield coils, (e.g., main coil X is connected to shield coil X', main coil Y is connected to shield coil Y', and main coil Z is connected to shield coil Z').

Figure 2:
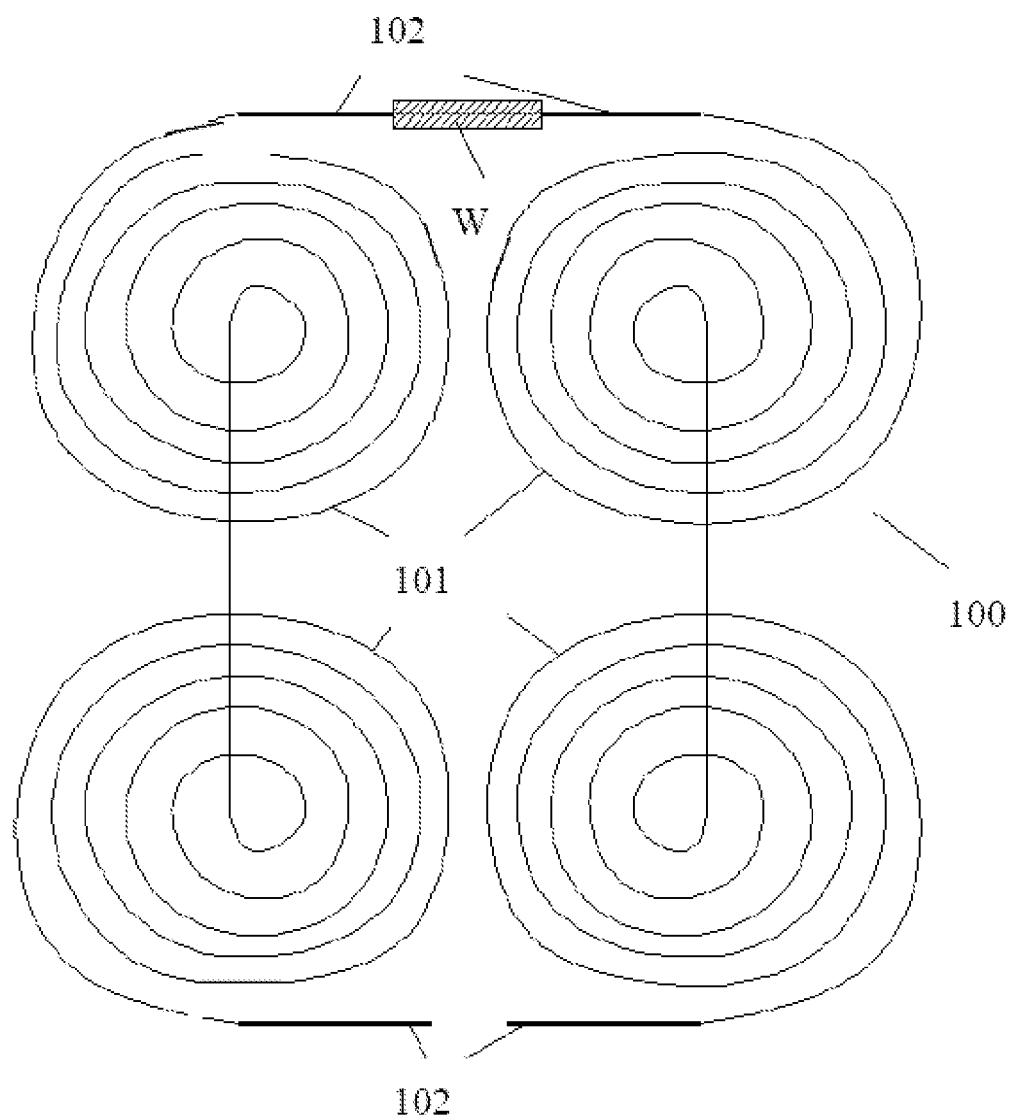
FIG. 2 depicts a schematic diagram of a main coil (or shield coil) of a gradient coil according to a particular embodiment.

FIG. 2 is a schematic diagram of a main coil (or shield coil) of a gradient coil according to a particular embodiment. The main coil (or shield coil) according to a particular embodiment includes two gradient coil assemblies 100. As FIG. 2 depicts, these two gradient coil assemblies 100 depict left-right symmetry. The gradient coil assembly 100 includes an aluminum wire body 101 and copper wire ends, the aluminum wire body 101 being made of aluminum, and the copper wire ends 102 being made of copper. The copper wire ends 102 are located at the two ends of the aluminum wire body 101, respectively, and the copper wire ends 102 are cold pressure welded to the aluminum wire body 101. Based on the positional relationship with the MRI system, the two ends may be referred to as the patient end (e.g., patient side) and the service end (e.g., service side). The cold pressure welding may be accomplished using handheld, standing, and/or automatic welding equipment. The cold pressure welding includes lap welding and butt welding, etc.

Specifically, the gradient coil GC according to a particular embodiment includes a main coil set MG and a shield coil set SG. As FIG. 1 depicts, the main coil set and the shield coil set are in the form of concentric cylinders, with the radius of the shield coil set being larger than that of the main coil set. The main coil set of the gradient coil, according to a particular embodiment, includes at least one layer of main coil. The main coil is formed by welding together one of two pairs of the copper wire ends 102 of the two gradient coil assemblies 100 of the main coil set of the gradient coil according to a particular embodiment with the copper wire ends 102 symmetrically placed relative to each other. As FIG. 2 depicts, the main coil is formed by welding together the upper pair of two pairs of the copper wire ends 102 of the two gradient coil assemblies 100 with the copper wire ends 102 symmetrically placed relative to each other. The shield coil set of the gradient coil according to a particular embodiment includes at least one layer of shield coil. The shield coil is formed by welding together one of two pairs of the copper wire ends 102 of the two gradient coil assemblies 100 with the copper wire ends 102 symmetrically placed relative to each other. As FIG. 2 depicts, the shield coil is formed by welding together the upper pair of two pairs of the copper wire ends 102 of the two gradient coil assemblies 100 with the copper wire ends 102 symmetrically placed relative to each other.

As FIG. 2 depicts, one end of one of the two gradient coil assemblies 100 of the main coil of the gradient coil according to a particular embodiment. For example, one of the copper wire ends 102 of one of the two gradient coil assemblies 100 is welded by flux to one end of the other of the two gradient coil assemblies 100, (e.g., one of the copper wire ends 102 of the other of the two gradient coil assemblies 100), to form a weld point W, thereby forming a main coil. Similarly, one end of one of the two gradient coil assemblies 100 of the shield coil of the gradient coil according to a particular embodiment. For example, one of the copper wire ends 102 of one of the two gradient coil assemblies 100, is welded to one end of the other of the two gradient coil assemblies 100, (e.g., one of the copper wire ends 102 of the other of the two gradient coil assemblies 100), thereby forming a shield coil.

In addition, the coil may be formed on its own, so as to have enough room to position cold pressure welding equipment to complete the cold pressure welding process.

During assembly of a gradient coil, the main coil set is connected to the shield coil. Due to limited space for operations, iron and flux are used to weld a main coil set and shield coil set made from copper wires. If aluminum wire alone is used as the coil, then it may be difficult to connect the main coil set to the shield coil set by the abovementioned method. However, the gradient coil according to a particular embodiment may also employ the abovementioned method, such that the gradient coil, according to a particular embodiment, includes an aluminum wire body and copper wire ends, and iron and flux may be used to connect the main coil to the shield coil set. This connection is accomplished by welding the copper wire ends of the main coil and shield coil, using the welding method known in the art.

Using the gradient coil according to a particular embodiment, it is possible to reduce gradient coil weight as well as reduce the thickness of an outer vacuum chamber used for a magnet, thereby reducing the cost of the magnet and gradient coil, and making it less difficult to install and maintain the magnet and gradient coil.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A gradient coil comprising:

at least two gradient coil assemblies, each assembly comprising an aluminum wire body and two copper wire ends, a first copper wire end connected by a cold pressure weld to a first end of the aluminum wire body and a second copper wire end connected by a cold pressure weld to a second end of the aluminum wire body;

a main coil set comprising at least one layer of main coil; and a shield coil set comprising at least one layer of shield coil, wherein the main coil set and the shield coil set are in the form of concentric cylinders, and a radius of the shield coil set is greater than a radius of the main coil set, wherein the main coil is provided by a weld of one of two pairs of the copper wire ends of two gradient coil assemblies with the copper wire ends symmetrically placed relative to each other, and wherein the shield coil is provided by a weld of one of two pairs of the copper wire ends of two of the gradient coil assemblies with the copper wire ends symmetrically placed relative to each other.

2. The gradient coil as claimed in claim 1, wherein the main coil set comprises three layers of the main coil, and the shield coil set comprises three layers of the shield coil.

3. The gradient coil as claimed in claim 2, wherein each layer of the main coil and each layer of the shield coil are welded together in a corresponding manner, according to the positions of each layer of the main coil and each layer of the shield coil in the main coil set and the shield coil set.

4. The gradient coil as claimed in claim 1, wherein each layer of the main coil and each layer of the shield coil are welded together in a corresponding manner, according to the positions of each layer of the main coil and each layer of the shield coil in the main coil set and the shield coil set.

5. The gradient coil assembly as claimed in claim 1, wherein the cold pressure weld comprises lap and butt connections.

6. A magnetic resonance imaging system comprising:

at least two gradient coil assemblies, each assembly comprising an aluminum wire body and two copper wire ends, a first copper wire end connected by a cold pressure weld to a first end of the aluminum wire body and a second copper wire end connected by a cold pressure weld to a second end of the aluminum wire body;

a main coil set comprising at least one layer of main coil; and a shield coil set comprising at least one layer of shield coil, wherein the main coil set and the shield coil set are in the form of concentric cylinders, and a radius of the shield coil set is greater than a radius of the main coil set, wherein the main coil is provided by a weld of one of two pairs of the copper wire ends of two gradient coil assemblies with the copper wire ends symmetrically placed relative to each other, and wherein the shield coil is provided by a weld of one of two pairs of the copper wire ends of two of the gradient coil assemblies with the copper wire ends symmetrically placed relative to each other.

* * * * *